United States Patent [19]

Fukuyama et al.

[11] Patent Number: 4,988,514

[45] Date of Patent: * Jan. 29, 1991

[54] PREPARATION OF LOWER ALKYL POLYSILSESQUIOXANE AND FORMATION OF INSULATING LAYER OF SILYLATED POLYMER ON ELECTRONIC CIRCUIT BOARD

[75] Inventors: Shun-ichi Fukuyama, Atsugi; Yasuhiro Yoneda, Machida; Masashi Miyagawa; Kota Nishii, both of Isehara; Azuma Matsuura, Atsugi, all of Japan

[73] Assignee: Fujitsu Limited, Kawasaki, Japan

[*] Notice: The portion of the term of this patent subsequent to Jun. 2, 2004 has been disclaimed.

[21] Appl. No.: 281,926

[22] Filed: Dec. 2, 1988

Related U.S. Application Data

[60] Continuation of Ser. No. 5,768, Jan. 21, 1987, abandoned, which is a division of Ser. No. 790,615, Oct. 23, 1985, Pat. No. 4,670,299.

[30] Foreign Application Priority Data

Nov. 1, 1984 [JP] Japan ................................ 59-228885
Mar. 29, 1985 [JP] Japan ................................ 60-63359
May 17, 1985 [JP] Japan ................................ 60-104035

[51] Int. Cl.$^5$ ........................ B32B 15/02; B32B 9/00
[52] U.S. Cl. .................................... 428/447; 428/448; 428/450; 428/457; 428/900; 428/901
[58] Field of Search ............... 428/429, 432, 457, 688, 428/901, 900, 433, 447, 448, 450

[56] References Cited

U.S. PATENT DOCUMENTS

| | | | |
|---|---|---|---|
| 3,017,386 | 1/1962 | Brown, Jr. et al. | 528/20 |
| 4,349,609 | 9/1982 | Takeda et al. | 428/447 X |
| 4,600,685 | 7/1986 | Kitakohji et al. | 430/313 |
| 4,657,843 | 4/1987 | Fukuyama et al. | 430/323 |
| 4,670,299 | 6/1987 | Fukuyama et al. | 427/96 |
| 4,719,125 | 1/1988 | Anello et al. | 428/447 X |

FOREIGN PATENT DOCUMENTS

0021818 1/1981 European Pat. Off. .
0046695 3/1982 European Pat. Off. .
0112168 6/1984 European Pat. Off. .

OTHER PUBLICATIONS

EP 85307905-European Search Report by Examiner Depijper at The Hague on Dec. 30, 1987.
Japanese Publication to Yogyo Kyokai Shi, vol. 92, No. 5, pp. 242 to 247, published May 1, 1984.

Primary Examiner—Merrell C. Cashion, Jr.
Assistant Examiner—Susan S. Rucker
Attorney, Agent, or Firm—Staas & Halsey

[57] ABSTRACT

A lower alkyl polysilsesquioxane having a general formula

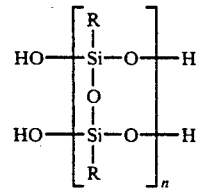

wherein R is CH$_3$ is C$_2$H$_5$, and n is an integer equal to about 50 to about 10,000, prepared by (a) dissolving a lower alkyl trifunctional silane in an organic solvent at a temperature of -31 20° C. to −50° C. to form an organic solution thereof; (b) hydrolyzing the lower alkyl trifunctional silane by dropping water into the organic solution at a temperature of −20° C. to −50° C. under an inert gas pressurized at 1,000 to 3,000 Pa; and (c) gradually heating the organic solution together with a water phase lying therebeneath up to a temperature of 60° C. to 100° C. under an inert gas pressurized at 1,000 to 3,000 Pa.

Also, a flat surfaced insulating layer of a silylated organopolysilsesquioxane having a general formula (Abstract continued on next page.)

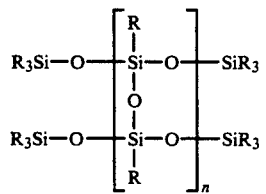
wherein R is an alkyl or phenyl group, and n is an integer equal to about 50 to about 2,000, preferably about 50 to about 500, formed on a circuit board having stepwise differences in height thereon, by applying an organic solution of the polymer; evaporating the solvent; and melting the polymer to flatten the surface of the polymer and curing the polymer.
13 Claims, 8 Drawing Sheets

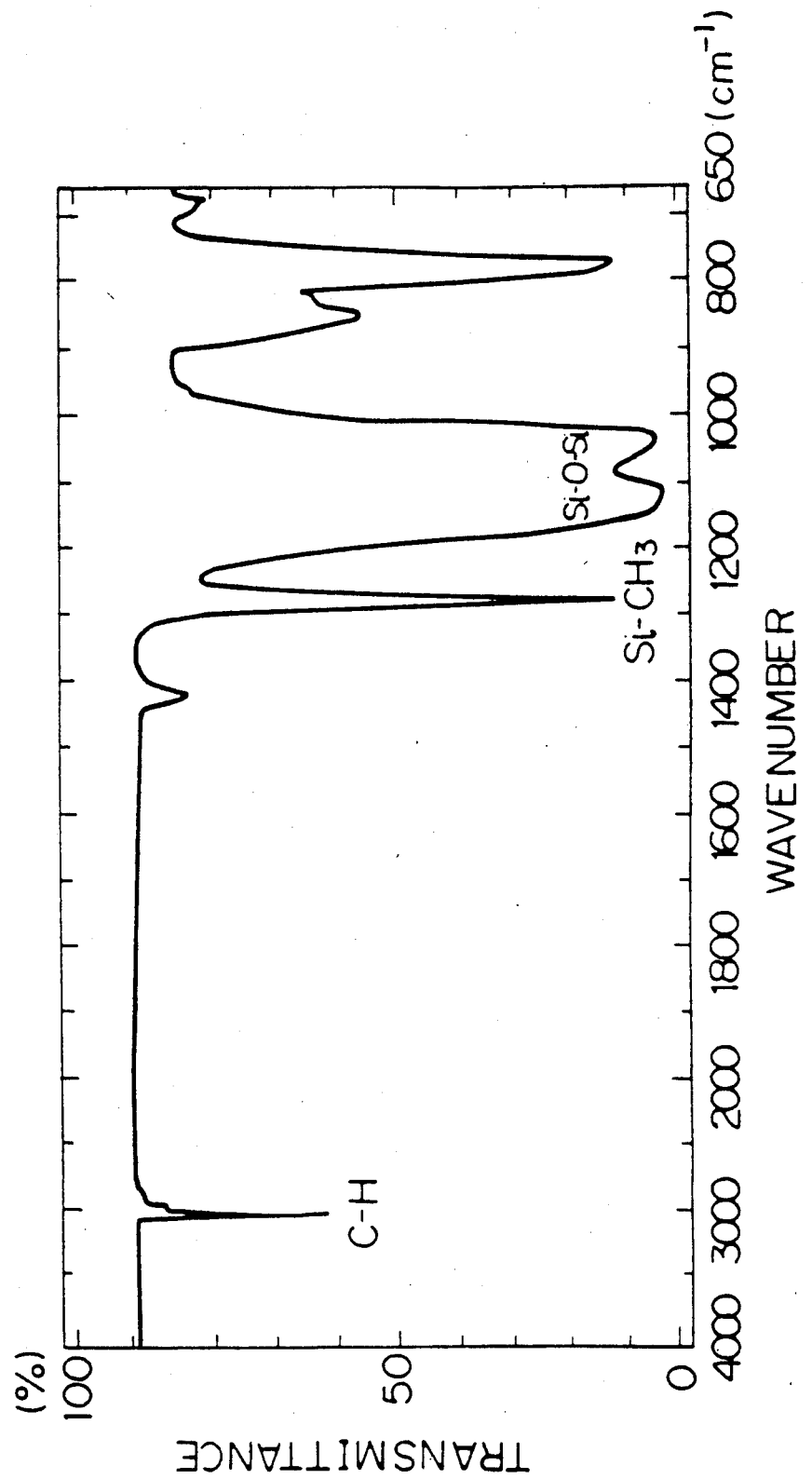

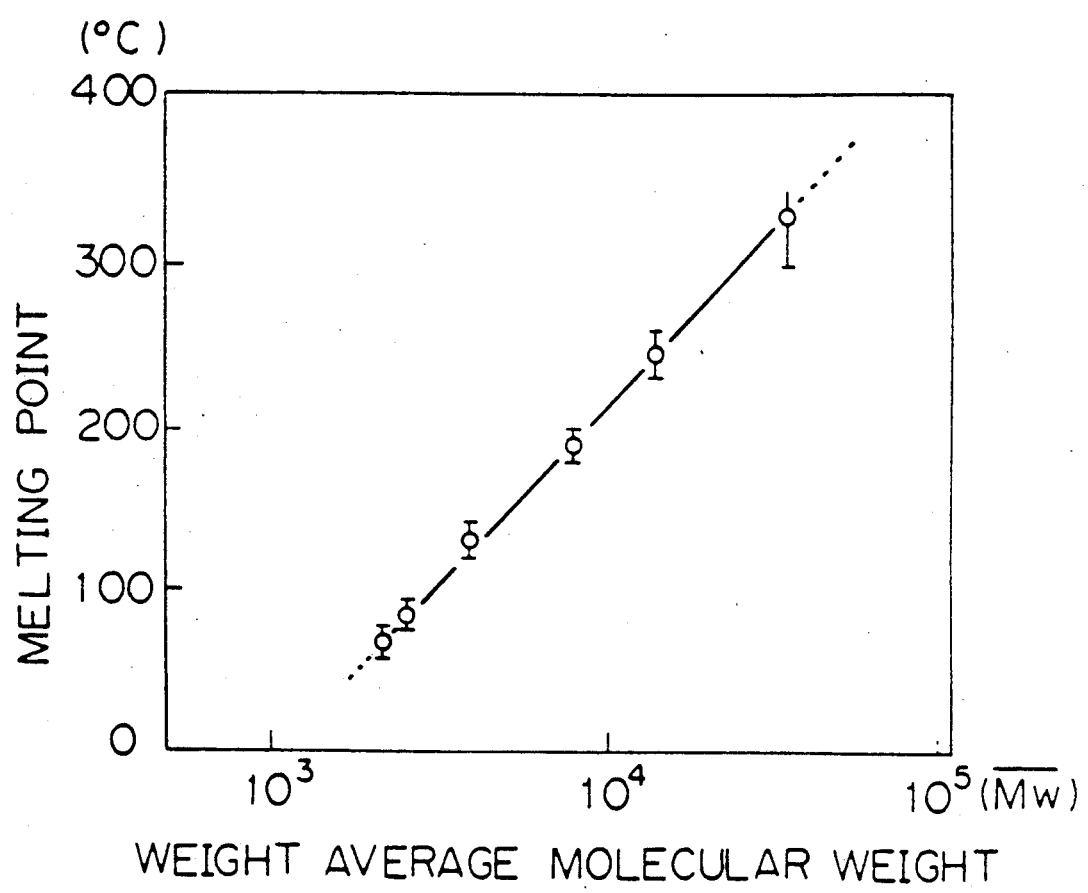

PREPARATION OF LOWER ALKYL POLYSILSESQUIOXANE AND FORMATION OF INSULATING LAYER OF SILYLATED POLYMER ON ELECTRONIC CIRCUIT BOARD

This is a continuation of co-pending application Ser. No. 005,768 filed on Jan. 21, 1987, now abandoned, which is a divisional of U.S. Ser. No. 790,615 now U.S. Pat. No. 4,670,299, filed 10/23/85.

BACKGROUND OF THE INVENTION

1. Field of the Invention

The present invention relates to a lower alkyl polysilsesquioxane adapted for forming an insulating layer of a silylated lower alkyl polysilsesquioxane on an electronic circuit board and a process for forming such an insulating layer which flattens stepwise differences in height due to micropatterns of conductors on an electronic circuit board.

2. Description of the Related Art

Insulating layers are commonly formed on electronic circuit boards having electronic elements, particularly integrated circuits, large scale integrated circuits, and magnetic bubble memory devices. The surface of these circuit boards exhibit stepwise differences in height due to the micropatterns formed thereon. Therefore, the insulating layers must exhibit flat step coverage. In addition, they must exhibit a thermal resistance to prevent thermal decomposition, a coefficient of expansion similar to that of the underlying material to prevent cracks, and a dense structure to prevent penetration of external gases or moisture, which would lead to deterioration of the performance of the electronic elements.

Insulating layers are usually made of inorganic oxides, e.g., phosphosilicate glass (PSG) and/or organic resins. Inorganic layers have the advantage of a relatively dense structure, however, in certain cases display insufficient step coverage. In addition, such layers produced by plasma chemical vapor deposition or sputtering have the disadvantage of not forming a desirable thickness in an acceptable duration of operation.

On the other hand, organic resins, e.g., polyimide, exhibit fair step coverage and, consequently, a flat surface profile. However, they have the demerits of a coarse structure, consequently, high hygroscopic property, lack of resistance against thermal decomposition and thermal shock. Furthermore, organic resins have to be readily dissolvable in an organic solvent to allow them to be applied to the electronic circuit board.

An organosilicone resin has been noted to exhibit combined features of organic and inorganic materials. Particularly, organopolysilsesquioxanes having a so-called ladder structures, i.e., a two-dimensional structure, are more resistant against thermal decomposition than organopolysiloxanes having a linear structure.

Brown et al report in U.S. Pat. No. 3,017,386 that phenyl polysilsesquioxane exhibits fair resistance against thermal decomposition.

It is known that phenyl polysilsesquioxane suffers from cracking in the process of curing, and that methyl polysilsesquioxane exhibits reduced cracking. Takiguchi et al, however, report in Japanese Unexamined Patent Publication (Kokai) No. 50-111198 that methyl polysilsesquioxane produced by a process in which methyl trichlorosilane reacts mildy with water has the demerit of insolubility in an organic solvent. This insolubility derives from the formation of a three-dimensional structure due to cross-linking at hydroxide groups, which are produced by hydrolyzation of methyl groups and not spent for polycondensation of polysilsesquioxane. Therefore, it is essential to conduct hydrolyzation of methyl trichlorosilane in extraordinarily mild conditions.

Brown et al to General Electric Co. disclose in U.S. Pat. No. 3,017,386 a process for preparing an organopolysilsesquioxane. A phenyl prepolymer is formed by reacting phenyl trichlorosilane in an organic solvent with alkaline water at a temperature of about 75° C. to 175° C., washing the hydrolyzate with water, and removing essentially all of the water by azeotropic distillation. The resulting solution of the prepolymer is then treated at a temperature of about 250° C. to obtain an organopolysilsesquioxane having a polymerization degree of several hundred to several thousand or more.

Takiguchi et al to Shin-etsu Kagaku Kogyo Ltd. disclose in Japanese Unexamined Patent Publication No. 50-111198 a process for preparing a lower alkyl polysilsesquioxane. First, a prepolymer of a number average molecular weight of 9,000 to 10,000 is formed by dissolving methyl trichlorosilane together with triethyl amine in a ketone-furan solvent and hydrolyzing ice-cooled methyl trichlorosilane with dropping water under normal pressure. Second, the prepolymer is precipitated by adding methyl alcohol to the hydrolyzed solution and then, dissolved again in a ketone-furan solvent and heated at 90° C. for 4 hours to obtain a polymer of a number average molecular weight of about 10,000 to about 100,000.

Sumie et al to Nihon Gosei Gomu Ltd. disclose in Japanese Unexamined Patent Publication No. 53-88099 a process similar to that of Takiguchi et al. Sumie et al found that the obtained methyl polysilsesquioxane became insoluble after further standing at room temperature, although the polymer has a relatively low number average molecular weight of about 5,000. Sumie et al treated the once separated prepolymer with an ammonium salt dissolved in water or methyl alcohol at about 90° C. for 4 hours to obtain methyl polysilsesquioxane of a number average molecular weight of about 20,000 to about 100,000. They found that the obtained polymer did not become insoluble after standing.

In regard to organopolysilsesquioxanes adapted for use as an insulating layer, as we previously stated, phenyl polysilsesquioxane exhibits a fair resistance against thermal decomposition but not against thermal cracking and that a low alkyl polysilsesquioxane exhibits a resistance reverse to that of phenyl polysilsesquioxane.

Kamiya et al disclose in Yogyo Kyokai Shi, Vol. 92, No. 5, pages 242 to 247, published May 1, 1984, a process to improve the thermal resistance of a diorganosiloxane polymer by replacing the active hydroxide end radicals with trimethyl silyl groups. However, such a silylated siloxane polymer has not been applied for insulating layers of an electronic circuit board.

Sudo et al to Hitachi Ltd. disclose in Japanese Unexamined Patent Publication No. 55-50645 an organopolysilsesquioxane layer formed on and near the surface of a semiconductor device. Most of the organic groups are selected from the groups of phenyl and methyl. Part of the organic grops are selected from the groups of C2 to C6 alkyl, vinyl, halogenized phenyl, hydroxyl alkyl, mercaptoalkyl, alkyl phenyl, and aminophenyl. Shoji et al to Hitachi Ltd. disclose in Japanese Unexamined Patent Publication No. 55-145355 a layer insulating layer of organopolysilsesquioxane in which organic radicals are selected from the groups of methyl, ethyl, propyl, butyl, phenyl, halogenophenyl, halogenomethyl phenyl, and amyl hexyl phenyl ethyl.

Tokunaga et al to Fujitsu Ltd. disclose in Japanese Unexamined Patent Publication No. 56-125857 a process for producing a semiconductor device in which methyl polysilsesquioxane is used to flatten the stepwise lower portion between underlying micropatterns of conductors and an inorganic insulating layer is formed thereon. However, Tokunaga et al do not refer at all to the active end groups of the methyl polysilsesquioxane.

Neither Sudo et al, Shoji et al, nor Tokunaga et al teach or suggest to replace the active end radicals of the organopolysilsesquioxane with trialkyl silyl groups.

SUMMARY OF THE INVENTION

It is an object of the present invention to provide a process for preparing a lower alkyl polysilsesquioxane in one reaction system, wherein a lower alkyl trichlorosilane-containing organic phase coexists with a water phase underlying the same.

It is another object of the present invention to provide a process for preparing a lower alkyl polysilsesquioxane resistant against thermal decompostion.

It is still another object of the present invention to provide a process for preparing a lower alkyl polysilsesquioxane resistant against cracking.

It is yet another object of the present invention to provide a process for preparing a lower alkyl polysilsesquioxane soluble in an organic solvent, even after standing for a long time.

It is a further other object of the present invention to provide a process for producing a flat surfaced insulating layer on an electronic circuit board having stepwise differences in height due to micropatterns of conductors formed thereon.

In one aspect of the present invention, there is provided a process for preparing a lower alkyl polysilsesquioxane having a general formula

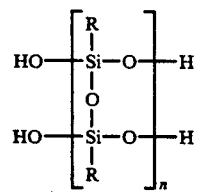

wherein R is CH$_3$ or C$_2$H$_5$, and n is an integer of about 50 to about 10,000, comprising the steps of:

(a) dissolving a lower alkyl trifunctional silane, e.g., a trihalogenosilane, preferably a lower alkyl trichlorosilane, or a trialkoxy silane in an organic solvent at a temperature of −20° C. to −50° C. to form an organic solution thereof;

(b) hydrolyzing the lower alkyl trifunctional silane, preferably a lower alkyl trichlorosilane, or a trialkoxy silane by dropping water into the organic solution at a temperature of −20° C. to −50° C. under an inert gas pressurized at 1,000 to 3,000 Pa; and (c) gradually heating the organic solution together with a water phase lying therebeneath up to a temperature of 60° C. to 100° C. under an inert gas pressurized at 1,000 to 3,000 Pa.

In another aspect of the present invention, there is provided a process for forming a flat surfaced insulating layer comprising the steps of:

applying a layer of an organic solution of a silylated organopolysilsesquioxane having a general formula

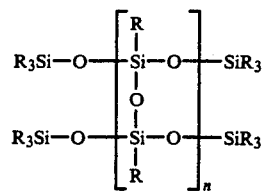

wherein R is an alkyl or phenyl group, and n is an integer equal to about 50 to about 2,000, preferably about 50 to about 500, on an electronic circuit board having stepwise differences in height thereon;

then evaporating the solvent; and melting the silylated organopolysilsesquioxane, thereby flattening the surface and curing the polymer.

BRIEF DESCRIPTION OF THE DRAWINGS

FIG. 2 is a diagram showing the relationship between infrared transmittance through trimethyl silylated methyl polysilsesquioxane and the wave number;

FIG. 3 is a diagram showing the relationship between weight average molecular weight and the melting point of trimethyl silylated methyl polysilsesquioxane;

DESCRIPTION OF THE PREFERRED EMBODIMENTS

In the first aspect of the present invention, due to the treatment at a very low temperature in the stages of dissolving the lower alkyl trichlorosilane in an organic solvent and of dropping water into the resulting solution of the lower alkyl trichlorosilane, it is possible to control the reaction of the lower alkyl trichlorosilane with a trace of water, which may exist in the organic solvent, and with dropping water, thus to hydrolyze very gradually the lower alkyl trichlorosilane to form a prepolymer, thereby preventing the prepolymer from further polycondensating to have a three-dimensional structure.

Therefore, the later obtained polymer exhibits effective solubility in an organic solvent.

Figure 1:
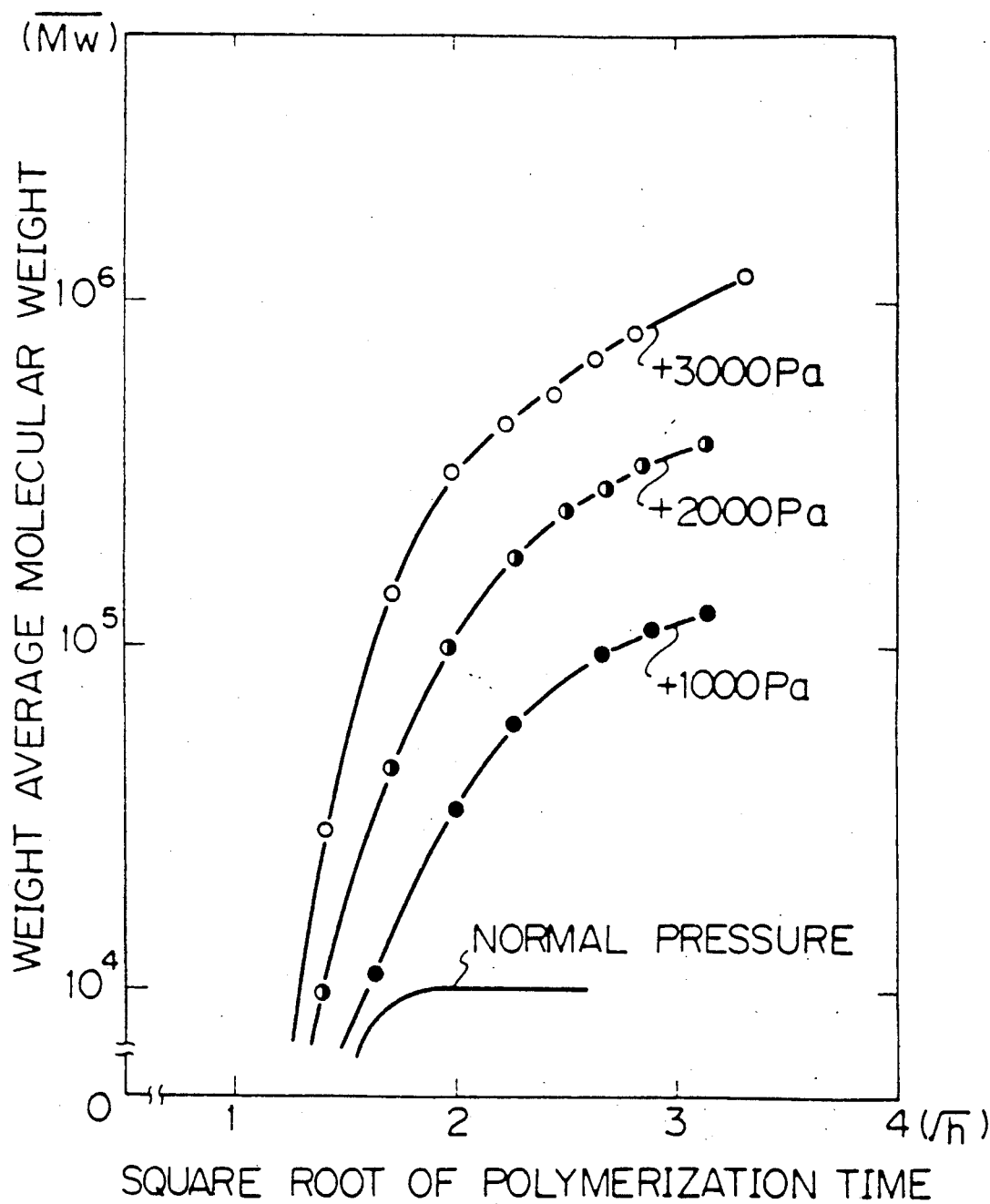
FIG. 1 is a diagram showing the relationship between the weight average molecular weight of methyl polysilsesquioxane and the square root of polymerization time at various pressures.

Owing to the pressurized inert gas atmosphere in the stages of dropping water into the lower alkyl trichlorosilane-containing organic phase and of heating the organic phase with a water phase lying therebeneath, it is possible to control the reaction of the lower alkyl trichlorosilane with water, while water is inhibited from evaporating to form microbubbles of water vapor which might come up into the organic phase where the lower alkyl trichlorosilane might react with water. Thus, the pressurized inert gas is one of the most characteristic features of the present invention. The inert gas is pressurized at 1,000 to 3,000 Pa. As shown in FIG. 1, the weight average molecular weight of the polymer does not increase with the increased duration of polymerization at normal pressures, however, the ratio of increasing the degree of polymerization can be enhanced by increasing the pressure of the inert gas from +1,000 Pa to +3,000 Pa. It is surprising that such a minor pressure is sufficient to control the polymerization degree of the polymer and inhibit the crosslinking of the polymer.

Thus, according to the present invention, formation of a lower alkyl polysilsesquioxane is carried out in one reaction system, i.e., in the presence of a water phase underlying the organic phase. The obtained polymer exhibits desirable features adapted for use as an insulating layer of semiconductor devices, i.e., a high molecular weight, which may be easily modified by changing the temperature and duration of the reaction, and a fair solubility in an organic solvent, even after standing storage over a few months.

The lower alkyl polysilsesquioxane may be methyl polysilsesquioxane, and the silylated alkyl polysilsesquioxane may be methyl polysilsesquioxane having trimethyl silyl end groups.

In the second aspect of the present invention, there is provided a process for forming an insulating layer of a silylated lower alkyl polysilsesquioxane having a general formul

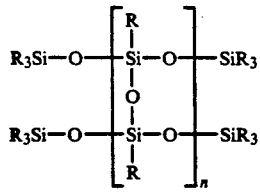

wherein R is CH$_3$ or C$_2$H$_5$, and n is an integer equal to about 50 to about 2,000, preferably about 50 to about 500, formed on a circuit board having stepwise differences in height thereon, by applying an organic solution of the polymer; evaporating the solvent; and melting the polymer to flatten the surface of the polymer and curing the polymer.

The insulating layer may be a layer insulating layer, or a passivation layer formed on the upper surface of the circuit board.

The electronic device having a multilayer wiring structure which includes a substrate, a first metal wiring layer formed on portions of the substrate and an interlayer insulation layer formed on the substrate and the first metal wiring layer. The interlayer insulation layer includes a cured coating of a ladder-type silylated silsesquioxane polymer having a general formula:

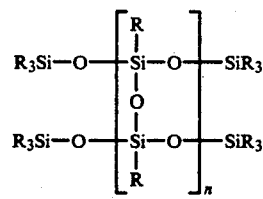

where R is one of a lower alkyl and phenyl group, and n is an integer between 50 and 10,000. A second metal wiring layer is formed on the interlayer insulation layer which is formed on the polymer.

The following examples refer to the preparation of methyl polysilsesquioxane. However, ethyl polysilsesquioxane can be similarly obtained according to the present invention. Also, a layer of silylated alkyl or phenyl polysilsesquioxane may be obtained.

EXAMPLE 1

An 84 ml amount of triethylamine and 540 ml amount of methyl isobutyl ketone were poured into a flask provided with a reflux condenser, a dropping funnel, a nitrogen-blowing pipe, and a stirrer.

The flask was purged with nitrogen. The flask was cooled at −30° C. to −40° C. by means of a dry-ice-cooled ethyl alcohol bath. A 78 ml amount of methyl trichlorosilane was added to the solution while stirring, to react with the trace of water dissolved in the solution and to generate hydrogen chloride, which reacted with the triethyl amine (C$_2$H$_5$)$_3$N to form a white precipitate of triethyl amine hydrogen chloride (C$_2$H$_5$)$_3$N.HCl.

Nitrogen pressurized at 1,000 Pa was introduced into the flask. About 100 ml of water was added drop by drop for 90 minutes to form triethyl amine hydrogen chloride, which was soluble in an excess of water to promote hydrolyzation of methyl trichlorosilane and to form a prepolymer of methyl polysilsesquioxane.

(1)

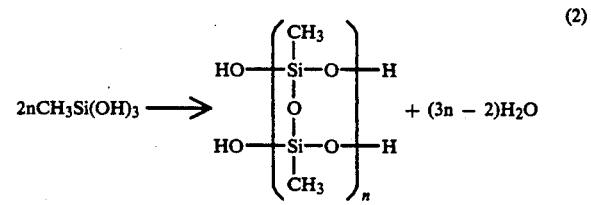

(2)

With the organic phase and the water phase in the flask kept under nitrogen pressurized at 1,000 Pa, the dry ice cooling was stopped. Thus, the temperature of the flask rose gradually up to room temperature. Then, the flask was heated to reflux on an oil bath, still under pressurized nitrogen, up to 90° C.±2° C. for 10 hours to achieve the polycondensation for obtaining high molecular methyl polysilsesquioxane.

The organic phase was separated from the water phase and washed with water until the triethyl amine hydrogen chloride was removed and the washing water became neutral. After removing the washing water, the organic phase was distilled to concentrate the same. Then, ethyl alcohol was added to the organic phase to precipitate high molecular methyl polysilsesquioxane. The precipitate was washed with ethyl alcohol and dried in vacuum. The obtained polymer was found to have a weight average molecular weight of 100,000, which corresponds to a polymerization degree of about 750, by means of gel permeation chromatographic analysis, and to have peak infrared absorption spectra of 3,000 cm$^{-1}$ ($v_{C-H}$), 780 cm$^{-1}$ ($v_{Si-CH}$), 1,125 cm$^{-1}$, and 1,040 cm$^{-1}$, the latter two recognized to be $v_{asym}$ Si-O-Si as described in J. Polym, Sci., Vol. C-1, p. 83 (1963). The infrared absorption spectra are shown in FIG. 2. Thus, the polymer was identified to be methyl polysilsesquioxane having a so-called ladder structure.

In addition, the obtained polymer was soluble in toluene or methyl isobutyl ketone solvent, even after standing 3 months at room temperature.

EXAMPLE 2

The same procedure was carried out as in Example 1, except that the nitrogen was pressurized at 3,000 Pa and that the reflux heating was continued for 4 hours. The obtained methyl polysilsesquioxane was found to have a weight average molecular weight of 600,000, which corresponds to a polymerization degree of about 4,500.

EXAMPLE 3

Methyl polysilsesquioxane was prepared by a procedure similar to Example 2, except that the reflux heating was continued for 8 hours. The obtained methyl polysilsesquioxane was found to have a weight average molecular weight of 1,000,000, which corresponds to a polymerization degree of about 7450.

COMPARATIVE EXAMPLE 1

The same procedures were carried out as in Example 1, except that the nitrogen was kept at normal pressure. The prepolymer information was conducted at a temperature as low as that of Example 1. The reflux heating was prolonged to 10 hours at 90° C.±2° C. The obtained polymer was found to have a weight average molecular weight of 40,000, which corresponds to a polymerization degree of as low as about 300.

EXAMPLE 4

The same procedure was carried out as in Example 2, except that the reflux heating was continued for 2 hours. The obtained methyl polysilsesquioxane, which had a polymerization degree of about 220, dissolved in a solvent mixture of 600 ml of methyl isobutyl ketone and 100 ml of pyridine. An 80 ml amount of trimethyl chlorosilane (CH$_3$)$_3$SiCl was added drop by drop to the solution at 50° C. to 60° C. to react with methyl polysilsesquioxane for 2 to 3 hours, whereby trimethyl silylated methyl polysilsesquioxane was obtained.

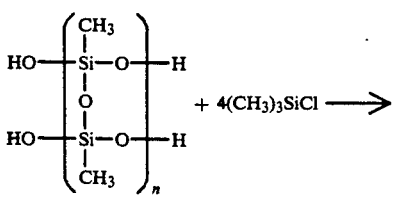
(3)

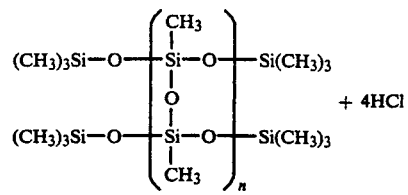

As shown in FIG. 4 (a), a silicon substrate 1 having an insulating layer 1', e.g., SiO$_2$ layer, was provided with patterns of aluminum 2 of 0.9 μm thickness, 3 μm minimum width, and 2 μm minimum spacing. A toluene solution of 20% by weight trimethyl silylatd polymethylsilsesquioxane having a weight average molecular weight of 30,000 which corresponds to a polymerization degree of about 220 was spun to coat the substrate 1 at 2,500 rpm for 40 seconds. The solvent was removed by heating at 80° C. for 30 minutes, then the polymer was melted to be flat and cured by heating under a nitrogen stream at 350° C. for 60 minutes. The heating temperature is preferable 350° C. to b 400° C. Because the molecular weight of trimethyl silylated methyl polysilsesquioxane is similar to that of nonsilylated polymer, its melting point can be estimated from the diagram of FIG. 3. The melting point of trimethyl silylated methyl polysilsesquioxane is linearly proportional to the weight average molecular weight, as shown in FIG. 3. Thus, the silylated polymer can melt at about 300° C.

The curing condition was determined in order that the cured silylated polymer does not decrease in its thickness after immersing for 5 minutes in solvents.

TABLE 1

| Temp. (°C.) | Time (min) | Thickness (μm) | After in acetone (μm) | After in xylene (μm) |
|---|---|---|---|---|
| 200 | 30 | 1.00 | 0.35 | 0.10 |
| 200 | 60 | 1.00 | 0.40 | 0.25 |
| 300 | 30 | 0.95 | 0.70 | 0.40 |
| 300 | 60 | 0.95 | 0.85 | 0.45 |
| 350 | 30 | 0.95 | 0.90 | 0.65 |
| 350 | 60 | 0.90 | 0.90 | 0.90 |
| 400 | 30 | 0.85 | 0.85 | 0.85 |

Thus, the condition was determined at 350° C. for 60 minutes. Because trimethyl silylated methyl polysilsesquioxane has no reactive hydroxy end radicals, thermal crosslinking of methyl groups may soleyl occur, consequently, a low density of crosslinking is secured after curing. Thus, the thickness of an insulating layer can be as thick as 3.5 μm on patterns of aluminum, which has a relatively large coefficient of thermal expansion, without suffering from cracking. The thickness of the polymer 3 was about 0.6 μm on the aluminum and about 1.5 μm on the area between the aluminum. Thus, the difference in height was almost completely eliminated, with at most 0.05 μm remaining.

The layered circuit structure provided with, as shown in FIG. 4 (b), trimethyl silylated methyl polysilsesquioxane as a passivation layer, was subjected to a pressure-cooker test at 120° C. under 2 atmospheres for 48 hours. No corrosion of aluminum was observed.

Figure 5:
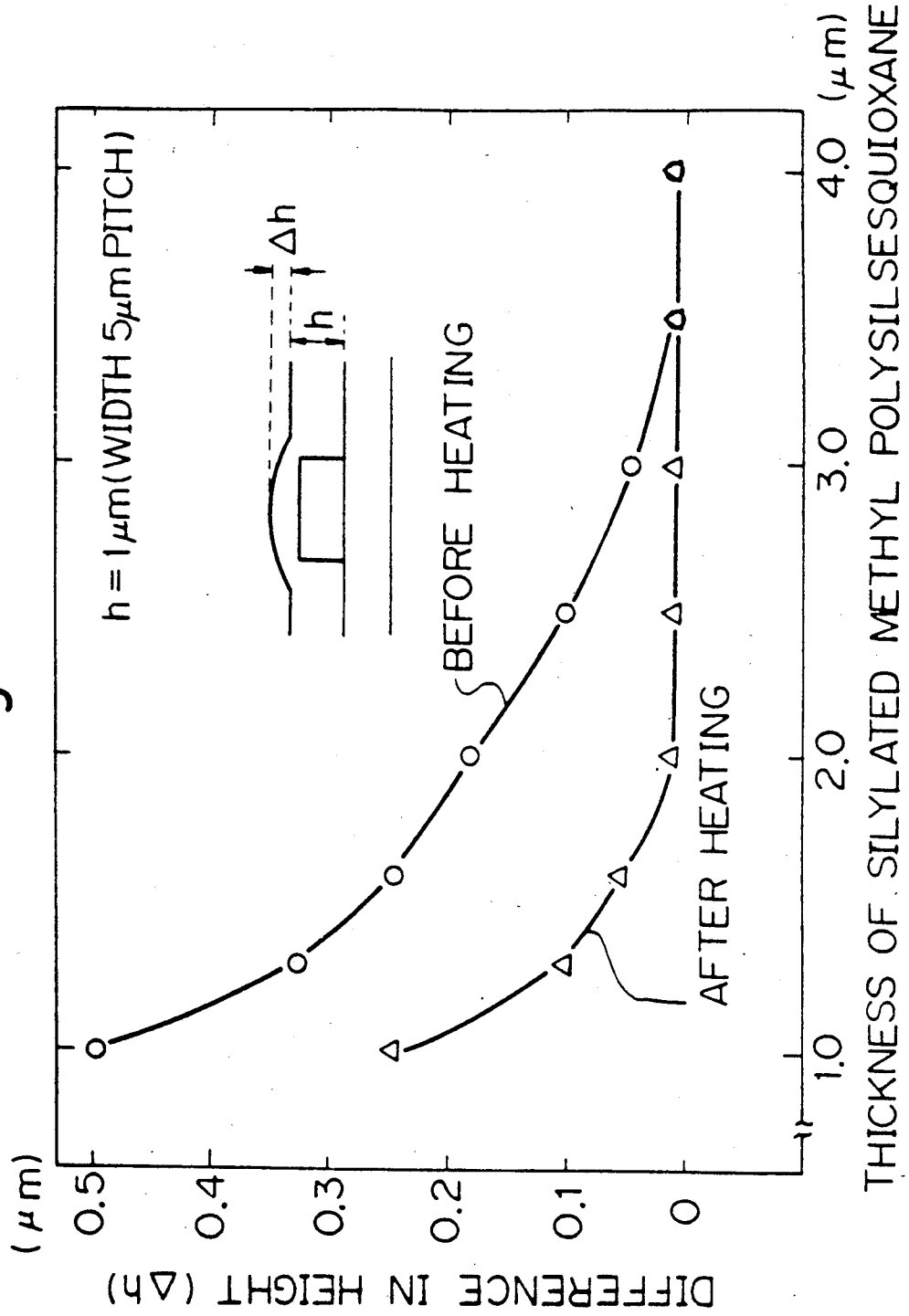
FIG. 5 is a diagram showing the relationship between the difference in height and thickness of silylated methyl polysilsesquioxane before and after heating.

FIG. 5 shows the step coverage relationship between the thickness of the silylated methyl polysilsesquioxane layers coated over a substrate having a stepwise difference in height of 1 μm.

One curve indicates the step coverage of the spin coated silylated methyl polysilsesquioxane over the substrate before melting of the polymer. The other curve indicates the step coverage by melting and flowing the silylated methyl polysilsesquioxane to form a flat surface.

The step coverage can be improved by melting the silylated polymer.

The leveling property of the silylated methyl polysilsesquioxane was evaluated as the thickness 1.2 μm of the spin coated polymer layer over the substrate having stepwise differences in height of 1 μm, to flatten or to decrease the stepwise differences less than 0.1 μm. On the other hand, that of the nonsilylated methyl polysilsesquioxane was more than 3.0 μm.

Figure 6:
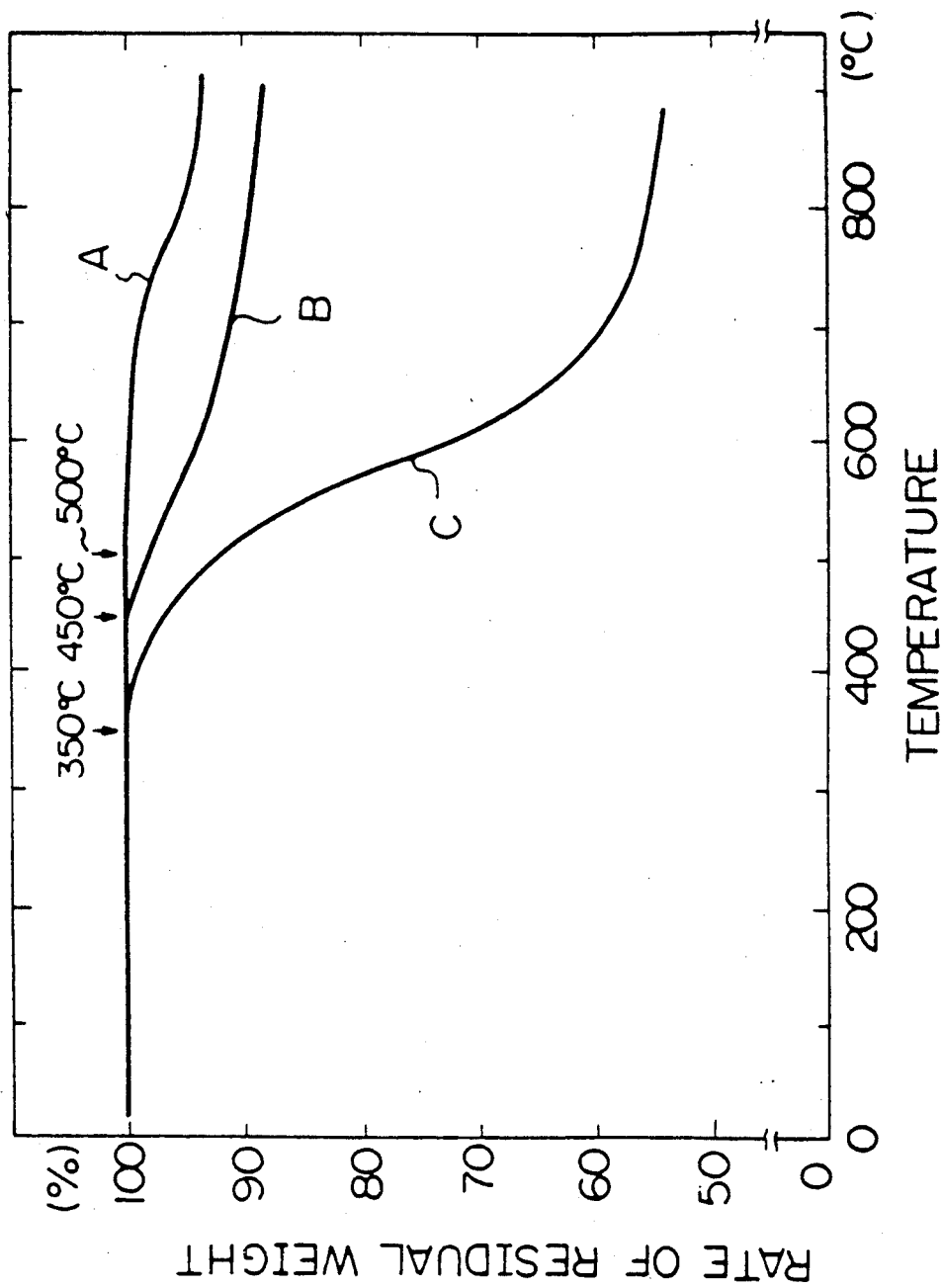
FIG. 6 is a diagram showing the relationship between rate of residual weight of silylated and nonsilylated methyl polysilsesquioxane and polyimide.

An insulating layer of polymer formed on aluminum patterns was subjected to thermal analysis up to 900° C., and the ratio of residual weight of the polymers was determined. As shown in FIG. 6, the silylated polymer (curve A) exhibits substantially no weight decrease up to 700° C. while nonsilylated polymer (curve B) begins to lose weight at 450° C. A polyimide resin (curve C), shown for comparison, decreases far more rapidly.

Table 2 indicates the results of a comparative test of the resistance properties against crack generation of silylated methyl polysilsesquioxane and nonsilylated methyl polysilsesquioxane.

The test was carried out by heating samples in which the two kind of polymers were spun on a substrate, having a stepwise difference between the conductive layer and insulating layer formed on a silicon substrate.

The samples were heated at a temperature of 500° C. for 1 hour under a nitrogen atmosphere.

The stepwise difference in height was 1 μm. The thicknesses of the coated polymers on the substrate were varied in the range of from 0.5 μm to 4.0 μm. The conductive or insulating pattern had a thickness of 1 μm.

Aluminum was used for conductive patterns, and $SiO_2$ was used for insulating patterns.

TABLE 2

| Thickness of polymers (μm) | Polymers | | | |
|---|---|---|---|---|
| | Silylated on Al | Non-ed on Al | Silylated on $SiO_2$ | Non-ed on $SiO_2$ |
| 0.5 | o | Δ | o | o |
| 1.0 | o | x | o | Δ |
| 1.5 | o | x | o | x |
| 2.0 | o | x | o | x |
| 2.5 | o | x | o | x |
| 3.0 | o | x | o | x |
| 3.5 | Δ | x | o | x |
| 4.0 | x | x | Δ | x | o - No cracks
Δ - Cracks occurred on part of the surface
x - Cracks occurred over all the surface As seen from Table 2 above, non-silylated methyl polysilsesquioxane has insufficient resistance against crack generation. On the other hand, the silylated methyl polysilsesquioxane of the present invention has a good resistance against crack generation although the thickness of the polymers is about 4 μm.

Silylated low alkyl polysilsesquioxane, obtained by silylating the residual active hydrogen in OH group in the polysilsesquioxane, can retain a molecular structure able to relax mechanical strain after heating and be melted to form a flat surface by suppressing the proportion of the thermal cross-linkage.

Consequently, the silylated lower alkyl polymethylsilsesquioxane of the invention has superior resistance against crack generation.

EXAMPLE 5

A silicon substrate having an insulating layer on the surface thereof was provided with pattern of aluminum. A 4-methyl-2-pentanone (MIBK) solution of trimethyl silylated polymethylsilsesquioxane having a weight average molecular weight of about 30,000, which corresponds to a polymerization degree of about 220, was spun to coat the substrate. The solvent was removed by evaporation, then the polymer was melted to form a flat surface and cured by heating under a nitrogen stream at 350° C. for 60 minutes. The thickness of the polymer was about 2 μm. Thus formed polymer layer can be used for the passivation layer, and the difference in height was almost completely eliminated.

The silicon circuit structure provided with trimethyl silylated methyl polysilsesquioxane as a passivation layer was subjected to a pressure-cooker test at 120° C. under 2 atmospheres for 48 hours. No corrosion of aluminum was observed.

COMPARATIVE EXAMPLE 2

A bipolar semiconductor element was produced similar to Example 5, except that nonsilylated methyl polysilsesquioxane was coated instead of the silylated methyl polysilsesquioxane. A toluene solution of 20% by weight methyl polysilsesquioxane was spun to coat the substrate at 2500 rpm for 40 seconds. The solvent was removed by heating at 80° C. for 30 minutes, then the polymer was heat treated under a nitrogen atmosphere at 350° C. for 60 minutes. Cracks were observed in the formed methyl polysilsesquioxane polymer layer on the aluminum layer. The difference in height remained at 0.2 μm, when the original difference in height was 1 μm.

COMPARATIVE EXAMPLE 3

A silicon substrate having an $SiO_2$ insulating layer on the surface thereof was provided with patterns of aluminum. The $SiO_2$ passivation layer of 1 μm thickness was formed by plasma chemical vapor deposition. The length of time needed for forming the passivation layer of 1 μm thickness was about 5 to 10 minutes and the step coverage was not good.

The silicon circuit structure provided with this plasma CVD $SiO_2$ as a passivation layer was subjected to a pressure-cooker test at 120° C. under 2 atmosphere for 10 hours corrosion of aluminum was observed.

EXAMPLE 6

Figure 4A:
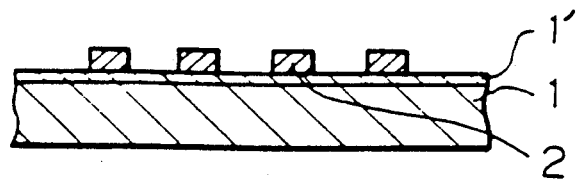
FIG. 4(a) to (f) are sectional views showing the process of producing an insulating layer on an electronic device.
Figure 4B:
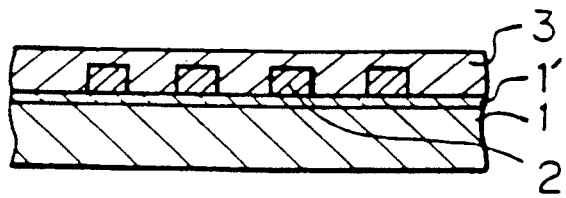
Figure 4C:
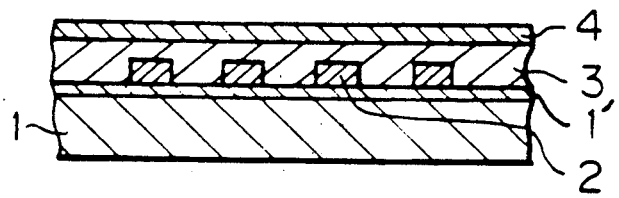
Figure 4D:
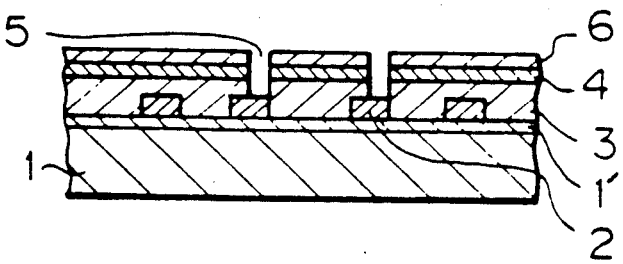
Figure 4E:
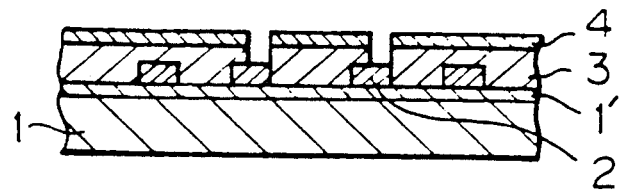
Figure 4F:
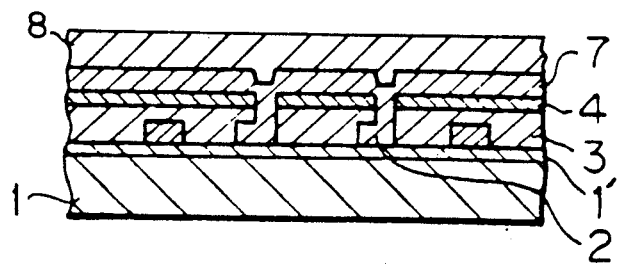

As shown in FIG. 4(a), a silicon substrate 1 having an inorganic insulating layer 1', e.g., $SiO_2$ layer was provided with patterns of aluminum 2 of 1 μm thickness. A methyl isobutyl ketone solution of 20% by weight trimethyl silylated methyl polysilsesquioxane having a weight average molecular weight (MW) of 30,000, which corresponds to a polymerization degree of about 220, and a ratio of the weight average molecular weight to a number average molecular weight (MW/MN), i.e., degree of dispersion, of 1.2 was spun to coat the substrate 1 at 4,000 rpm. The solvent was removed by heating at 120° C. for 10 minutes, then the polymer was melted to form a flat surface and cured by heating at 350° C. for 60 minutes. The thus formed trimethyl silylated methyl polysilsesquioxane layer having a thickness of 1.2 to 1.4 μm enabled flattening of the stepwise differences between the substrate and aluminum layer. The thickness of the polymer 3 was about 1.2 to 1.4 μm on the area between the aluminum. Thus, the difference in height was almost completely eliminated, with at most 0.05 μm remaining.

Figure 7:
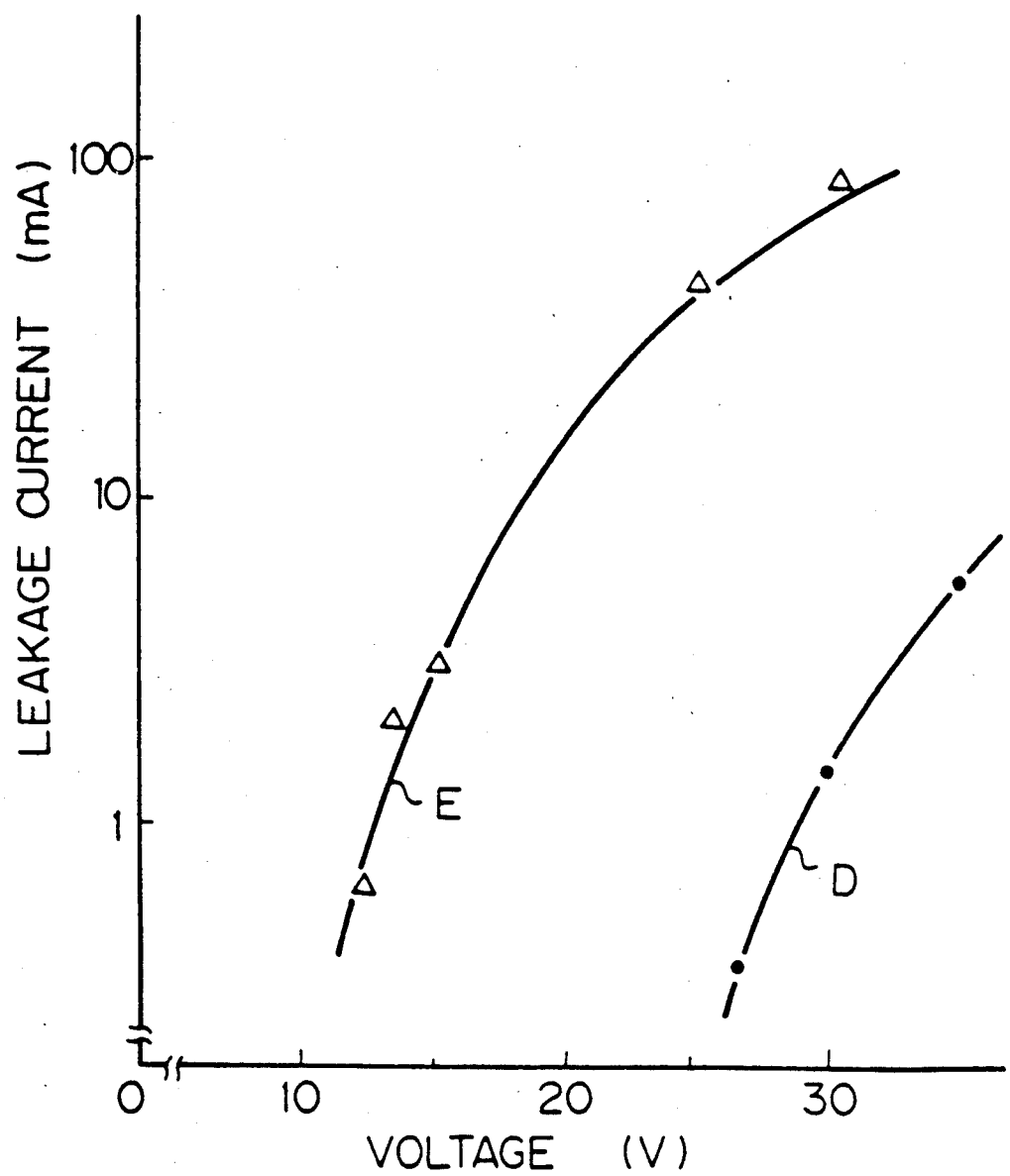
FIG. 7 is a diagram showing the relationship between voltage and leakage current through insulating layers: a double layer of silylated methyl polysilsesquioxane and PSG, and a single layer of PSG.
Figure 8:
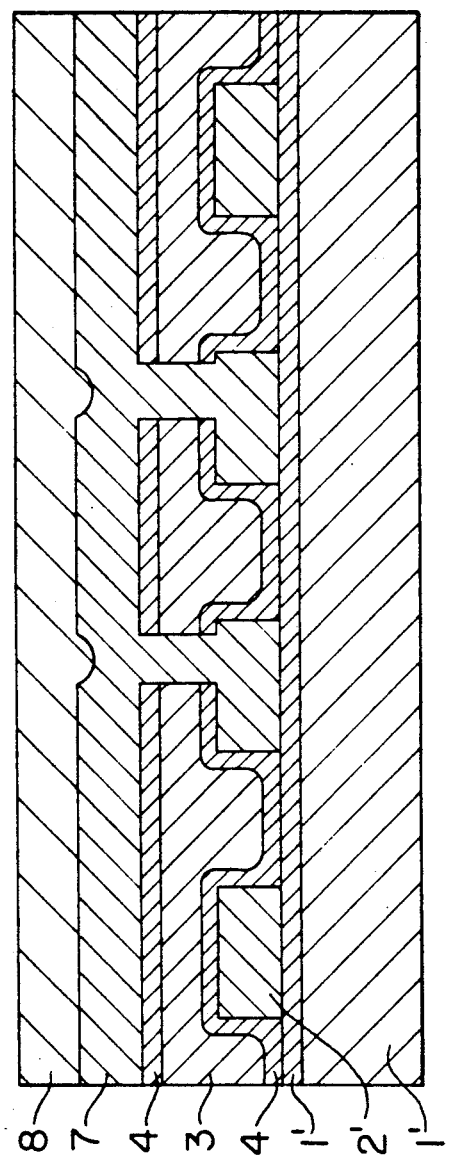
Figure 9:
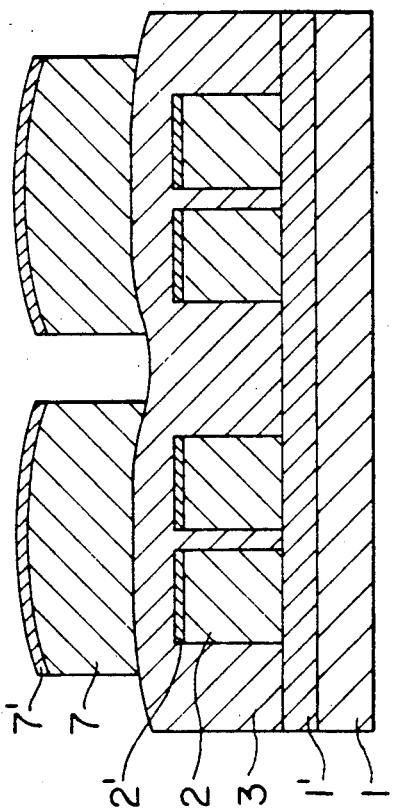

Next, an inorganic PSG layer 4 of 1.0 μm thickness was formed by chemical vapor deposition on the flat surface of the trimethyl silylated methyl polysilsesquioxane layer 3, as shown in FIG. 4 (c). Through holes 5 were opened by CF$_4$ plasma etching of the insulating layers 3 and 4 using a mask 6 of photoresist registered tradename "AZ 1340". Thereafter, the photoresist 6 was eliminated by O$_2$ plasma etching, and then second aluminum layer 7 of 1 μm thickness was deposited to connect to the first aluminum 2 via the through holes 5, and a passivation layer, i.e., protecting layer 8, was formed on the aluminum layer 7 which is similar to the polymer insulating layer 3 as shown in FIG. 4 (d) to FIG. 4 (f). The resultant multilayer circuit structure was subjected to an electric leakage test. No electric leakage was observed, as shown in curve D of FIG. 7, by applying 25 volts. Furthermore, the multilayer circuit structure was subjected to a reliability test, i.e., first to heating at 250° C. for 500 hours and second to thermal shock of −65° C. to 150° C. for 500 hours, in which one cycle continued one and a half hours. Thereafter, no electric leakage was observed by applying 25 volts.

COMPARATIVE EXAMPLE 4

A multilayer circuit board was produced similar to Example 5 except that no trimethyl silylated methyl polysilsesquioxane layer 3 was formed, in other words, only an inorganic insulating layer was formed. The obtained multilayer circuit structure exhibited leakage of approximately 1 mA upon applying 13 volts, as shown in Curve E of FIG. 7, in an electric leakage test similar to that of Example 6.

EXAMPLE 7

A trimethyl silylated methyl polysilsesquioxane layer was formed by a procedure similar to Example 4, except that the trimethyl silylated methyl polysilsesquioxane was applied on a magnetic bubble memory having a layer of nickel-iron. That is, a 4-methyl-2-pentanone solution of 20% by weight trimethyl silylated methyl polysilsesquioxane having a weight average molecular weight of about 31,000 which corresponds to a polymerization degrees of about 230 was spun to coat a magnetic bubble memory having a layer of a nickel-ion alloy, registered tradename "Permalloy". After removing the solvent, the polymer melted to form a flat surface and was cured by heating under nitrogen at 350° C. for 1 hour. In this case, the passivation layer of the polymer had a thickness of 2 μm.

The magnetic bubble memory provided with trimethyl silylated methyl polysilsesquioxane as a passivation layer was subjected to a pressure-cooker test at 120° C. under 2 atmospheres for 48 hours. No corrosion of the nickel-iron alloy was observed.

COMPARATIVE EXAMPLE 5

A 4-methyl-2-pentanone solution of 20% by weight nonsilylated methyl polysilsesquioxane having a polymerization degree of about 230 was spun to coat a magnetic bubble memory having a layer of a nicel-ion alloy, registered tradename "Permalloy." After removing the solvent, the polymer was cured by heating under nitrogen at 350° C. for 1 hour. In this case, the passivation layer of the polymer had a thickness of 1 μm. Because this nonsilylated methyl polysilsesquioxane layer generated cracks after heating when the thickness was greater than 1 μm, the step coverage was insufficient. In addition, after a pressure cooker test at 120° C. under 2 atmospheres for 30 hours, corrosion of the nickel-ion alloy was observed.

We claim:

1. An electronic device having a multilayer wiring structure comprising:
   a substrate;
   a first metal wiring layer formed on portions of said substrate;
   an interlayer insulation layer formed on said substrate and said first metal wiring layer and comprising a cured coating of a ladder-type silylated silsesquioxane polymer having a general formula:

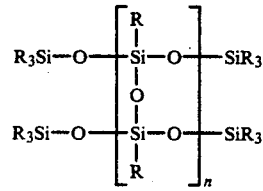

where R is selected from one of a methyl, ethyl and phenyl group, and n is an integer between 50 and 10,000 thereby providing a silylated silsesquioxane polymer which is capable of melting and forming a flat plane; and
   a second metal wiring layer formed on said interlayer insulation layer.

2. An electronic device according to claim 1, further comprising an inorganic insulating layer formed between said second metal wiring layer and said interlayer insulating layer.

3. An electronic device according to claim 1, wherein said electronic device is a semiconductor device.

4. An electronic device according to claim 1, wherein said electronic device is a magnetic bubble memory device.

5. An electronic device according to claim 1, wherein R is selected from the group consisting of $CH_3$ and $C_2H_5$.

6. An electronic device according to claim 1, wherein said silylated polysilsesquioxane is ethyl polysilsesquioxane having triethyl silylated end groups and having an average molecular weight of approximately $8.4 \times 10^3$ to $3.2 \times 10^5$.

7. An electronic device according to claim 1, wherein said silylated polysilsesquioxane is methyl polysilsesquioxane having trimethyl silylated end groups and having an average molecular weight of approximately $7.0 \times 10^3$ to $2.7 \times 10^5$.

8. An electronic device having a multiple layer wiring structure comprising:
   a passivation layer, formed on an upper wiring layer in the multiple layer wiring structure, said passivation layer comprising a cured coating of a ladder-type silylated silsesquioxane polymer having a general formula:

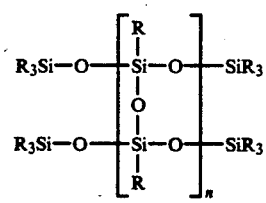

where R is selected from one of a methyl, ethyl and phenyl group, and n is an integer between 50 and 10,000, thereby providing a silylated silsesquioxane polymer capable of melting and forming a flat plane.

9. An electronic device according to claim 8, wherein said electronic device is a semiconductor device.

10. An electronic device according to claim 8, wherein said electronic device is a magnetic bubble memory device.

11. An electronic device according to claim 8, wherein R is $CH_3$ or $C_2H_5$.

12. An electronic device according to claim 8, wherein said silylated polysilsesquioxane is ethyl polysilsesquioxane having triethyl silylated end groups and having an average molecular weight of approximately $8.4 \times 10^3$ to $3.2 \times 10^5$.

13. An electronic device according to claim 8, wherein said silylated polysilsesquioxane is methyl polysilsesquioxane having trimethyl silylated end groups and having an average molecular weight of approximately $7.0 \times 10^3$ to $2.7 \times 10^5$.

* * * * *